United States Patent
Jeon et al.

(10) Patent No.: US 10,437,143 B2
(45) Date of Patent: Oct. 8, 2019

(54) PELLICLE FOR EXPOSURE TO EXTREME ULTRAVIOLET LIGHT, PHOTOMASK ASSEMBLY, AND METHOD OF MANUFACTURING THE PELLICLE

(71) Applicant: Samsung Electronics Co., Ltd., Suwon-si, Gyeonggi-do (KR)

(72) Inventors: Hwan-chul Jeon, Seoul (KR); Mun Ja Kim, Suwon-si (KR); Sung-won Kwon, Suwon-si (KR); Hee-bom Kim, Hwaseong-si (KR); Chang-young Jeong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 106 days.

(21) Appl. No.: 15/627,916

(22) Filed: Jun. 20, 2017

(65) Prior Publication Data

US 2018/0284599 A1    Oct. 4, 2018

(30) Foreign Application Priority Data

Mar. 28, 2017   (KR) .................. 10-2017-0039301

(51) Int. Cl.
| | | |
|---|---|---|
| G03F 1/64 | (2012.01) | |
| G03F 1/22 | (2012.01) | |
| G03F 1/24 | (2012.01) | |
| G03F 1/62 | (2012.01) | |
| G03F 7/20 | (2006.01) | |

(52) U.S. Cl.
CPC ............... *G03F 1/64* (2013.01); *G03F 1/22* (2013.01); *G03F 1/24* (2013.01); *G03F 1/62* (2013.01); *G03F 7/2008* (2013.01)

(58) Field of Classification Search
CPC ..... G03F 1/22; G03F 1/24; G03F 1/62; G03F 1/64
USPC .......................................................... 430/5
See application file for complete search history.

(56) References Cited

U.S. PATENT DOCUMENTS

| | | | |
|---|---|---|---|
| 6,623,893 B1 | 9/2003 | Levinson et al. | |
| 6,811,936 B2 | 11/2004 | Smith et al. | |
| 7,666,555 B2 | 2/2010 | Goldstein et al. | |
| 7,767,985 B2 | 8/2010 | Okoroanyanwu et al. | |
| 7,901,846 B2 | 3/2011 | Kubota et al. | |
| 8,018,578 B2 | 9/2011 | Banine et al. | |
| 9,355,842 B2 | 5/2016 | Seacrist et al. | |
| 9,482,960 B2 | 11/2016 | Yakunin et al. | |
| 10,162,258 B2 * | 12/2018 | Lin ........................... | G03F 1/24 |
| 2013/0250260 A1 | 9/2013 | Singh | |
| 2016/0033860 A1 | 2/2016 | Wiley et al. | |
| 2016/0139500 A1 | 5/2016 | Kim et al. | |
| 2016/0247942 A1 | 8/2016 | Jeon et al. | |
| 2016/0334698 A1 | 11/2016 | Jeon et al. | |
| 2017/0038675 A1 | 2/2017 | Ahn et al. | |

FOREIGN PATENT DOCUMENTS

| | | |
|---|---|---|
| JP | 2016-080967 A | 5/2016 |
| KR | 101676095 B1 | 11/2016 |

OTHER PUBLICATIONS

Jeon, et al. "Boron carbide (BC) as a promising capping material for improvement of EUV pellicle," pp. 1-2 (2006).
A. Gao et al., "Extreme ultraviolet induced defects on few-layer graphene" Journal of Applied Physics, 114, 044313 AIP Publishing. (2013).
Sungwon Kwon et al., "Thermal limitation of Silicon EUV Pellicle and possible improvements for mass production of EUV Lithography" Samsung DIGITall everyone's invited, Oct. 6, 2015.
L.B. Begrambekov et al., "Behavior of Boron Doped Graphites and Boron Carbide Under Ion Beam and Plasma Irradiation". National Research Nuclear University MEPhI, Moscow, Russia. Springer Science Business Media B.V.2011.

* cited by examiner

*Primary Examiner* — Christopher G Young
(74) *Attorney, Agent, or Firm* — Harness, Dickey & Pierce, P.L.C.

(57) ABSTRACT

Provided is a pellicle for exposure to extreme ultraviolet light (EUVL) according to an example embodiment, and the pellicle includes a pellicle membrane; and a frame attached to the pellicle membrane, wherein the pellicle membrane includes a carbon-based main layer that has a first surface and a second surface, which are two surfaces opposite to each other; and a boron-based enhancement layer covering at least one surface selected from the first surface and the second surface. The pellicle according to an example embodiment may be used for an extended period of time in an extreme ultraviolet light exposure environment.

14 Claims, 15 Drawing Sheets

PELLICLE FOR EXPOSURE TO EXTREME ULTRAVIOLET LIGHT, PHOTOMASK ASSEMBLY, AND METHOD OF MANUFACTURING THE PELLICLE

CROSS-REFERENCE TO RELATED APPLICATION

This application claims the benefit of Korean Patent Application No. 10-2017-0039301, filed on Mar. 28, 2017, in the Korean Intellectual Property Office, the disclosure of which is incorporated herein in its entirety by reference.

BACKGROUND

Inventive concepts relates to a pellicle for extreme ultraviolet light exposure, a photomask assembly, and a method of manufacturing the pellicle. More particularly, inventive concepts relate to a pellicle for extreme ultraviolet light exposure over an extended period of time in an extreme ultraviolet light exposure environment, a photomask assembly, and a method of manufacturing the pellicle.

The pellicle may be placed over a photomask with a desired (or alternatively, predetermined) gap to help protect a surface of the photomask from external particles. The pellicle is desired to remain free from deformation or breakage for a set period of time or longer when exposed to light during a lithography process. There is a desire for a pellicle that can tolerate prolonged exposure to hydrogen plasma when exposed to ultraviolet light during a lithography process.

SUMMARY

Inventive concepts provide a pellicle for exposure to extreme ultraviolet light which is usable for an extended period of time in an extreme ultraviolet light exposure environment.

Inventive concepts provide a method of manufacturing the pellicle for exposure to extreme ultraviolet light which is usable for an extended period of time in an extreme ultraviolet light exposure environment.

Inventive concepts provide a photomask assembly for exposure to extreme ultraviolet light which is usable for an extended period of time in an extreme ultraviolet light exposure environment.

According to an example embodiment of inventive concepts, there is provided a pellicle for extreme ultraviolet light (EUVL) exposure, the pellicle including a pellicle membrane including a carbon-based main layer having a first surface and a second surface opposite to the first surface, and a boron-based enhancement layer covering at least one of the first surface and the second surface. The pellicle further includes a frame attached to the pellicle membrane.

According to an example embodiment of inventive concepts, there is provided a pellicle for EUVL, the pellicle comprising including a pellicle membrane including a carbon-based main layer having a first surface and a second surface opposite to the first surface, a hydrogen plasma resistant chemical enhancement layer covering at least one of the first surface and the second surface, an intermixing layer exists across an interface between the carbon-based main layer and the chemical enhancement layer includes a component derived from the carbon-based main layer and a component derived from the chemical enhancement layer. The pellicle further includes a frame attached to the pellicle membrane.

According to an example embodiment, provided is a method of manufacturing a pellicle for exposure to EUVL, the method including, forming a catalyst layer on a supporting substrate, forming a boron-based material layer on the catalyst layer, forming a carbon-based main layer on the boron-based material layer, and removing the supporting substrate and the catalyst layer.

According to an example embodiment, provided is a photomask assembly for exposure to EUVL, the photomask assembly comprising a pellicle comprising a pellicle membrane and a frame attached to the pellicle membrane, the pellicle membrane including a carbon-based main layer having a first surface and a second surface opposite to the first surface the pellicle membrane further including a boron-based enhancement layer coating at least one of the first surface and the second surface. The photomask assembly further comprises a photomask having a surface to which the pellicle is fixed.

According to an example embodiment, provided is photolithography system including a reticle stage, a reticle on a first surface of the reticle stage, and a pellicle membrane on a first surface of the reticle, the pellicle membrane including a carbon-based main layer having a first surface and a second surface opposite to the first surface, and a boron-based enhancement layer covering at least one of the first surface and the second surface.

According to an example embodiment, provided is a method of manufacturing an electronic system comprising fixing a photomask assembly onto a mask stage, the photomask assembly including a pellicle comprising a pellicle membrane and a frame attached to the pellicle membrane, the pellicle membrane including a carbon-based main layer having a first surface and a second surface opposite to the first surface the pellicle membrane further including a boron-based enhancement layer coating at least one of the first surface and the second surface, the photomask assembly including a photomask having a surface to which the pellicle is fixed, exposing a photoresist layer on a wafer to light by using the photomask to form a photoresist pattern, and processing a feature layer by using the photoresist pattern.

BRIEF DESCRIPTION OF THE DRAWINGS

Example embodiments of inventive concepts will be more clearly understood from the following detailed description taken in conjunction with the accompanying drawings in which.

DETAILED DESCRIPTION OF THE EXAMPLE EMBODIMENTS

In photolithography, pellicle damage due to heat and hydrogen plasma is a concern which is desired to be resolved with regards to mass production when using a beam of energy including extreme ultraviolet (EUV) light or an electron beam. When heat applied during the photolithography process is not appropriately removed, thermal stress due to accumulated heat may cause pellicle damage. Also, during the photolithography process, the pellicle may be exposed to hydrogen plasma, and crystalline defects on a pellicle surface may be seed points, e.g. starting points from which damage caused by hydrogen plasma may start and develop. Such pellicle damage may shorten the lifespan of the pellicle. Thus, a pellicle that more easily dissipates heat and has a surface tolerant to hydrogen plasma is desired.

According to one or more example embodiments, provided is a pellicle that is protected from damage caused by impurities. The pellicle is obtained by protecting or helping to protect a photomask from external defect elementals during light exposure. In particular, when the pellicle membrane emits heat fast and is chemically resistant to hydrogen plasma in a light-exposure environment using extreme ultraviolet light, chemical deformation of the pellicle may be reduced, and the lifespan of the pellicle may be extended. Also, in a pellicle membrane in which heterogeneous membranes are stacked, the lifetime of the pellicle may be further extended by significantly improving an adhesive strength between the heterogeneous membranes.

Figure 1:
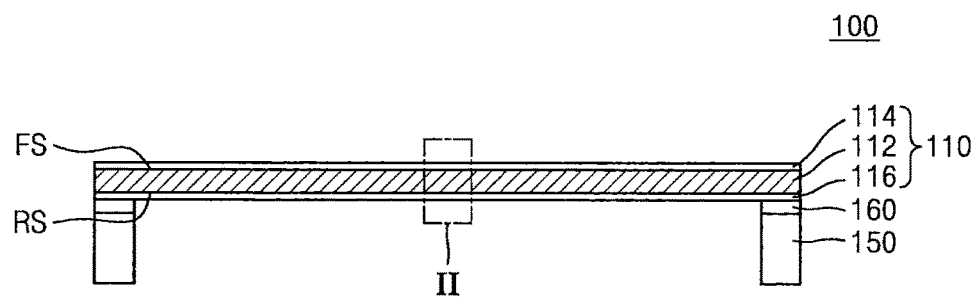
FIG. 1 is a cross-sectional view illustrating a pellicle according to an example embodiment.

FIG. 1 is a cross-sectional view illustrating a pellicle 100 according to an example embodiment.

Referring to FIG. 1, the pellicle 100 includes a pellicle membrane 110 and a frame 150. The frame 150 may be attached to the pellicle membrane 110 and may support the pellicle membrane 110.

The frame 150 may be attached to the pellicle membrane 110 by an adhesion layer 160. The pellicle membrane 110 may be kept flat in a free-standing structure on the frame 150.

The pellicle membrane 110 may include a carbon-based main layer 112 and chemical enhancement layers 114 and 116 each coating at least one of two surfaces FS and RS of the carbon-based main layer 112. In FIG. 1, the chemical enhancement layers 114 and 116 are shown as being formed on both of the two surfaces FS and RS of the carbon-based main layer 112, respectively. However, the chemical enhancement layer may be formed on only one of the two surfaces FS and RS of the carbon-based main layer 112.

The carbon-based main layer 112 may be or may include a material having an emissivity of 0.4 or higher, with carbon as a main component. In particular, the carbon-based main layer 112 may be or may include a material having a significantly greater number of sp3 bonds than sp2 bonds. For example, the carbon-based main layer 112 may be a material formed of sp2 bonds and sp3 bonds, with the number of sp3 bonds being 10 times or greater than that of the sp2 bonds. Alternatively, the carbon-based main layer 112 may be formed of or may include only sp2 bonds.

In some example embodiments, the carbon-based main layer 112 may include graphene, graphite, and/or carbon nanotubes (CNTs). The CNTs may include single wall CNTs (SWCNTs) and/or multi-wall CNTs (MWCNTs). However, example embodiments are not limited thereto.

The carbon-based main layer 112 may have a thickness in a range of about 10 nm to about 100 nm. When the thickness of the carbon-based main layer 112 is low or too low, mechanical strength of the pellicle membrane 110 may deteriorate, and the pellicle membrane 110 may be unable to maintain a free-standing structure. On the other hand, when the thickness of the carbon-based main layer 112 is high or too high, the transparency of the pellicle membrane 110 may deteriorate, which may negatively affect an extreme ultraviolet light photolithography process.

The carbon-based main layer 112 may have an emissivity of about 0.4 or greater. When the emissivity of the carbon-based main layer 112 is less than 0.4, the carbon-based main layer 112 may be weak in terms of heat-dissipation, and thus thermal stress may accumulate in a high-temperature environment at one or more points. Thermal stress may ultimately result in damage or breakage of the carbon-based main layer 112, thus may be desirable to be removed beforehand. When a polycrystalline silicon is used instead of the carbon-based main layer 112, since an emissivity of the polycrystalline silicon is significantly low (about 0.03), thermal stress is concentrated in a high-temperature environment, and thus the pellicle 100 may more easily break.

The chemical enhancement layers 114 and 116 may be material layers resistant to hydrogen plasma. For example, each of the chemical enhancement layers 114 and 116 may be a boron (B)-based material, a silicon (Si)-based material, or a 5th period transition metal.

The boron (B)-based material may include at least one selected from elemental boron, $B_4C$, a boron oxide, and a boron nitride. The silicon (Si)-based material may include at least one selected from a silicon oxide, a silicon nitride, and a silicon oxynitride. The 5th period transition metal may be at least one selected from ruthenium (Ru), zirconium (Zr), and molybdenum (Mo).

Figure 2:
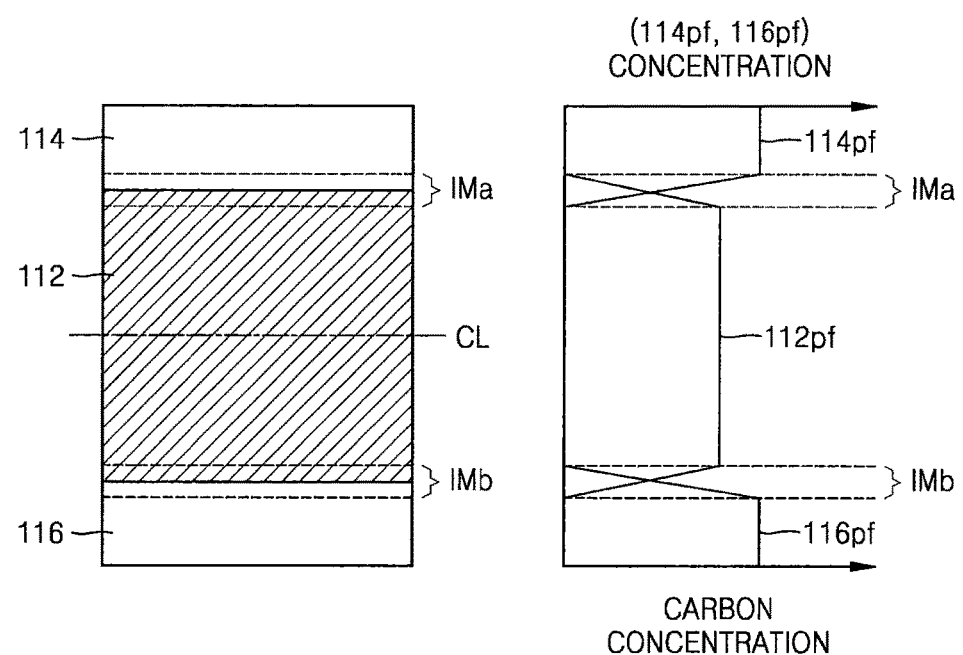
FIG. 2 is a zoomed-in schematic view of II of FIG. 1 illustrating a concentration profile of each layer.

FIG. 2 is a zoomed-in schematic view of II in FIG. 1 illustrating a concentration profile of each layer.

Referring to FIG. 2, a first intermixing layer IMa may exist across an interface between the carbon-based main layer 112 and the first chemical enhancement layer 114. The first intermixing layer IMa may be a layer in which carbon derived from the carbon-based main layer 112 and components, such as boron, silicon, and 5th period transition metal, derived from the first chemical enhancement layer 114 are mixed at the atomic level according to a change in concentration, e.g. a concentration gradient.

In some example embodiments, boundaries of the first intermixing layer IMa may be defined as boundaries of a region where the concentration gradient exists.

As shown in FIG. 2, a concentration gradient of carbon may exist in the interface between the carbon-based main layer 112 and the first chemical enhancement layer 114. In FIG. 2, 112$pf$ denotes a concentration profile of carbon in the carbon-based main layer 112, 114$pf$ denotes a concentration profile of a main ingredient of the first chemical enhancement layer 114, and 116$pf$ denotes a concentration profile of a main ingredient of the second chemical enhancement layer 116. The scale of an axis that represents the carbon concentration may be different from scales of axes that represent concentrations of the main ingredients of the first chemical enhancement layer 114 and the second chemical enhancement layer 116.

Since a center part of the carbon-based main layer 112 is substantially formed of carbon, regions from a center line CL of the pellicle membrane 110 to a location near the interface between the first chemical enhancement layer 114 and the carbon-based main layer 112 may be substantially formed of carbon. A carbon concentration may gradually decrease, e.g. descend toward near the interface between the first chemical enhancement layer 114 and the carbon-based main layer 112 from the center line CL. Also, a concentration of the components derived from the first chemical enhancement layer 114 may gradually increase along with the gradual decrease of the carbon concentration.

Also, a second intermixing layer IMb may exist across an interface between the carbon-based main layer 112 and the second chemical enhancement layer 116 in the middle. The second intermixing layer IMb may be a layer in which carbon derived from the carbon-based main layer 112 and components, such as boron, silicon, and 5th period transition metal, derived from the second chemical enhancement layer 116 are mixed at the atomic level according to a concentration gradient.

As shown in FIG. 2, a concentration gradient of carbon may exist in the interface between the carbon-based main layer 112 and the second chemical enhancement layer 116. Description of this concentration gradient is the same as that of the interface between the carbon-based main layer 112 and the first chemical enhancement layer 114, and thus the repeated description will be omitted herein.

As described above, the first and second intermixing layers IMa and IMb are those in which the carbon-based main layer 112 and the chemical enhancement layers 114 and 116 are partially mixed at the atomic level, and thus the first and second intermixing layers IMa and IMb may exhibit good, or excellent adhesive strength for attaching the carbon-based main layer 112 with the chemical enhancement layers 114 and 116.

In FIG. 2, the two intermixing layers IMa and IMb are shown as having the same width, but widths of the intermixing layers IMa and IMb may be different from each other. For example, the pellicle membrane 110 may have an asymmetrical concentration profile with respect to the center line CL. In some example embodiments, the first intermixing layer IMa may be thicker than the second intermixing layer IMb. In other example embodiments, the first intermixing layer IMa may be thinner than the second intermixing layer IMb.

Figure 3:
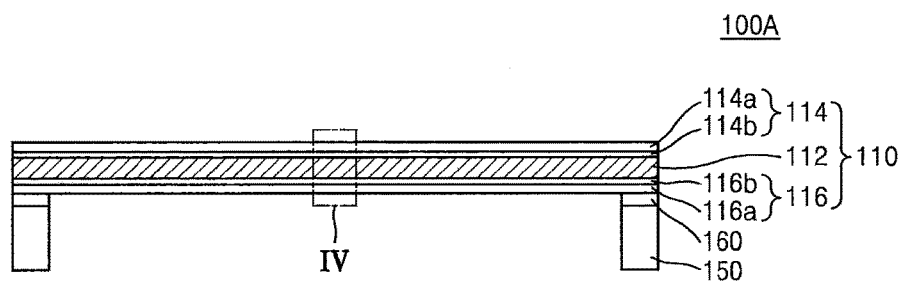
FIG. 3 is a cross-sectional view illustrating a pellicle according to another example embodiment.
Figure 4:
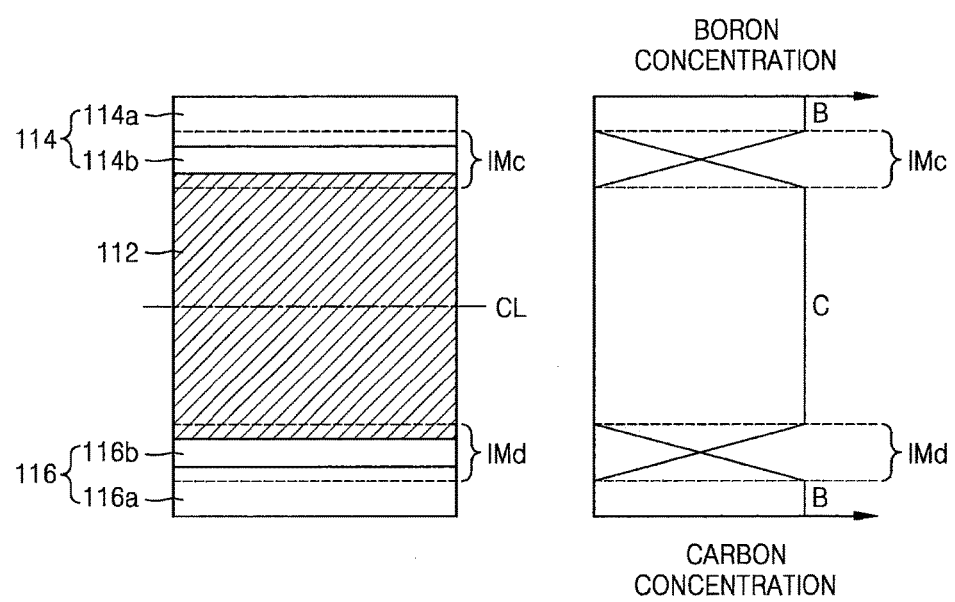
FIG. 4 is a zoomed-in schematic view of IV of FIG. 3 illustrating a concentration profile of each layer.

FIG. 3 is a cross-sectional view illustrating a pellicle 100A according to another example embodiment. FIG. 4 is a zoomed-in schematic view of IV in FIG. 3 illustrating a concentration profile of the layer.

Referring to FIGS. 3 and 4, the first chemical enhancement layer 114 and the second chemical enhancement layer 116 may be each formed of two layers 114$a$, 114$b$, 116$a$, and 116$b$. Here, an example of the first chemical enhancement layer 114 and the second chemical enhancement layer 116 being chemical enhancement layers of a boron-based material will be described.

The first chemical enhancement layer 114 may include a first layer 114$a$ having elemental boron as a main component; and a second layer 114$b$ having $B_4C$ as a main component. Also, the second chemical enhancement layer 116 may include a third layer 116$a$ having elemental boron as a main component and a fourth layer 116$b$ having $B_4C$ as a main component. Here, the term "main component" refers to a component having a weight percentage exceeding 50%.

As shown in FIG. 4, a concentration gradient of boron may exist throughout an interface between the first layer 114$a$ and the second layer 114$b$. In the graph of FIG. 4, a line indicated by B represents a concentration profile of boron, and a line indicated by C represents a concentration profile of carbon. The scale of an axis that represents a carbon concentration may be different from the scale of an axis that represents a boron concentration.

From a free surface of the first layer 114$a$ to a depth where the concentration gradient of boron starts may be regarded as a layer of elemental boron. The concentration of boron may gradually decrease and the concentration of $B_4C$ may increase in a direction toward the center of from the depth where the concentration gradient of boron starts. In this regard, the carbon concentration may ascend.

The concentration gradient of carbon may exist throughout an interface between the second layer 114$b$ and the carbon-based main layer 112. Since a center part of the carbon-based main layer 112 is formed of carbon, the entirety of area from the center line CL of the pellicle membrane 110 to near an interface between the second layer 114$b$ and the carbon-based main layer 112 may be substantially formed of carbon. Since a concentration of elemental boron or $B_4C$ gradually increases, e.g. ascends from the interface between the second layer 114$b$ and the carbon-based main layer 112 toward near the first layer 114$a$, the carbon concentration may gradually decrease.

A concentration gradient of boron may exist throughout an interface between the third layer 116$a$ and the fourth layer 116$b$. Description of this concentration gradient is the same as that of the interface between the first layer 114$a$ and the second layer 114$b$, and thus the repeated description will be omitted herein.

A concentration gradient of carbon may also exist throughout the interface between the fourth layer 116$b$ and the carbon-based main layer 112. Description of this concentration gradient is the same as that of the interface between the second layer 114$b$ and the carbon-based main layer 112, and thus the repeated description will be omitted herein.

In FIG. 4, a boron concentration and a carbon concentration are shown as linearly changing according to the depths of a third intermixing layer IMc and a fourth intermixing layer Imd, but the change in the boron concentration and/or the carbon concentration may follow a parabolic shape and/or may locally have an interval of a constant concentration.

In the third intermixing layer IMc, since carbon derived from the carbon-based main layer 112 and boron derived from the first layer 114a may be mixed or form $B_4C$, the adhesive strength between the carbon-based main layer 112 and the first layer 114a may be high. Also, in the fourth intermixing layer IMd, since carbon derived from the carbon-based main layer 112 and boron derived from the third layer 116a may be mixed or form $B_4C$, the carbon-based main layer 112 and the third layer 116a may be adhered at a strong adhesive strength.

Figure 5:
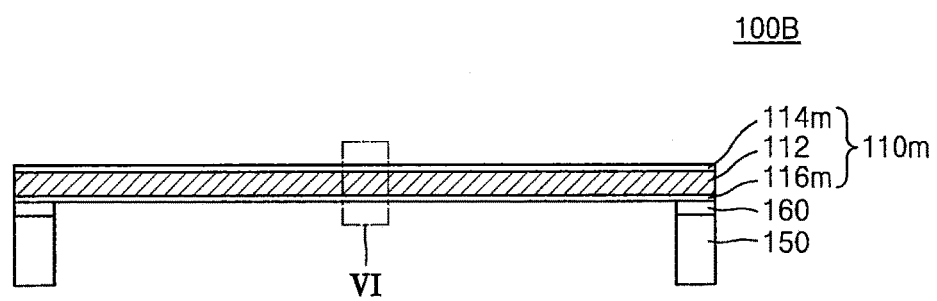
FIG. 5 is a cross-sectional view illustrating a pellicle according to another example embodiment.
Figure 6:
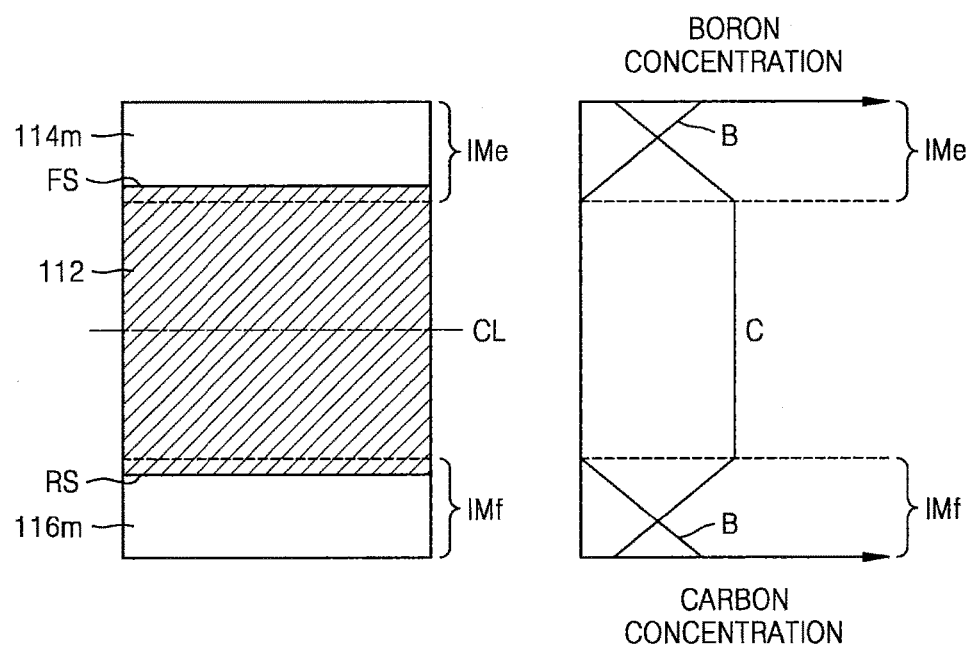
FIG. 6 is a zoomed-in schematic view of VI in FIG. 5 illustrating a concentration profile of each layer.

FIG. 5 is a cross-sectional view illustrating a pellicle 100B according to another example embodiment. FIG. 6 is a zoomed-in schematic view of VI in FIG. 5 illustrating a concentration profile of each layer.

Referring to FIGS. 5 and 6, a first chemical enhancement layer 114m is provided on a first surface FS of the carbon-based main layer 112, and a second chemical enhancement layer 116m may be provided on a second surface RS of the carbon-based main layer 112. Here, an example in which the first chemical enhancement layer 114m and the second chemical enhancement layer 116m are chemical enhancement layers of a boron-based material will be described.

The first chemical enhancement layer 114m and the second chemical enhancement layer 116m may be layers substantially having $B_4C$ as a main component. In the first chemical enhancement layer 114m, concentration gradients of carbon and boron may exist in a thickness direction thereof. In the second chemical enhancement layer 116m, concentration gradients of carbon and boron may exist in a thickness direction thereof. The first chemical enhancement layer 114m and the second chemical enhancement layer 116m may each have descending or decreasing carbon concentration toward a free surface. The first chemical enhancement layer 114m and the second chemical enhancement layer 116m may each have descending or decreasing boron concentration away from the free surface, unlike the example shown in FIG. 5. In some example embodiments, an interval may exist where the boron concentration is constant may not exist in the first chemical enhancement layer 114m and/or the second chemical enhancement layer 116m in a thickness direction, and the boron concentration may monotonically change.

As shown in FIG. 6, a carbon concentration gradient and/or a boron concentration gradient may exist throughout an interface between the first chemical enhancement layer 114m and the carbon-based main layer 112. In particular, a carbon concentration gradient and/or a boron concentration gradient may exist throughout the entirety of first chemical enhancement layer 114m and further up to a part of the carbon-based main layer 112. In this regard, the entirety of first chemical enhancement layer 114m may be included in a fifth intermixing layer IMe. For example, the fifth intermixing layer IMe may include the entirety of first chemical enhancement layer 114m and a part of the carbon-based main layer 112 adjacent to the first chemical enhancement layer 114m. In the graph of FIG. 6, a line indicated by B represents a concentration profile of boron, and a line indicated by C represents a concentration profile of carbon. The scale of an axis representing a carbon concentration may be different from the scale of an axis representing a boron concentration.

A carbon concentration gradient and/or a boron concentration gradient may exist throughout an interface between the second chemical enhancement layer 116m and the carbon-based main layer 112. In particular, a carbon concentration gradient and/or a boron concentration gradient may exist throughout the entirety of second chemical enhancement layer 116m and further up to a part of the carbon-based main layer 112. In this regard, the entirety of second chemical enhancement layer 116m may be included in a sixth intermixing layer IMf. For example, the sixth intermixing layer IMf may include the entirety of second chemical enhancement layer 116m and a part of the carbon-based main layer 112 adjacent to the second chemical enhancement layer 116m.

Thicknesses of the first chemical enhancement layers 114 and 114m and the second chemical enhancement layers 116 and 116m may be about 3% to about 20% of a thickness of the carbon-based main layer 112. In some example embodiments, thicknesses of the first chemical enhancement layers 114 and 114m and the second chemical enhancement layers 116 and 116m may be in a range of about 1 nm to about 10 nm.

When the thicknesses of the first chemical enhancement layers 114 and 114m and the second chemical enhancement layers 116 and 116m are low, e.g. too low, protection of the carbon-based main layer 112 from hydrogen plasma may be insufficient. On the other hand, when the thicknesses of the first chemical enhancement layers 114 and 114m and the second chemical enhancement layers 116 and 116m are high or too high, heat dissipation is not sufficient, and thus thermal stress may be accumulated therein.

Figure 7A:
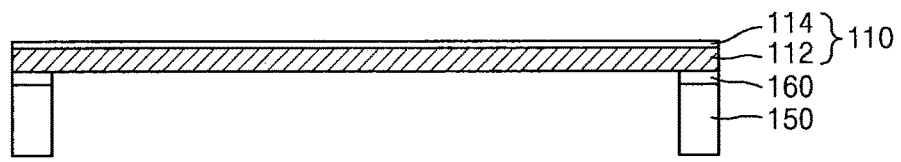
FIGS. 7A and 7B are cross-sectional views illustrating pellicles according to another example embodiment.
Figure 7B:
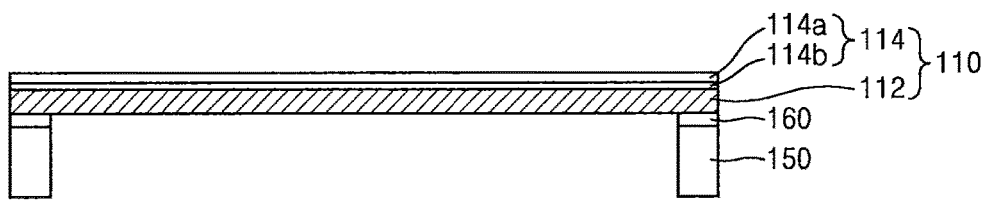

FIGS. 7A and 7B are cross-sectional views illustrating pellicles 100C and 100D according to another example embodiment.

Referring to FIGS. 7A and 7B, the pellicles 100C and 100D may be substantially the same as the pellicles 100, 100A, and 100B shown in FIGS. 1, 3, and 5, except that the second chemical enhancement layers 116 and 116m are omitted. Therefore, the repeated descriptions will be omitted herein.

In these example embodiments, the chemical enhancement layer 114 is only formed on one surface of the carbon-based main layer 112, and thus manufacture of the pellicles 100C and 100D may be simple and easy. Damage to the carbon-based main layer 112 due to hydrogen plasma may be problematic on a surface opposite to a surface facing a photomask but not on a surface facing from the photomask. Thus, even when the chemical enhancement layer 114 for protecting the carbon-based main layer 112 is only formed on a surface of the carbon-based main layer 112 that does not face the photomask, the problem of damage to the carbon-based main layer 112 may be reduced, e.g. mostly minimized.

Figure 8:
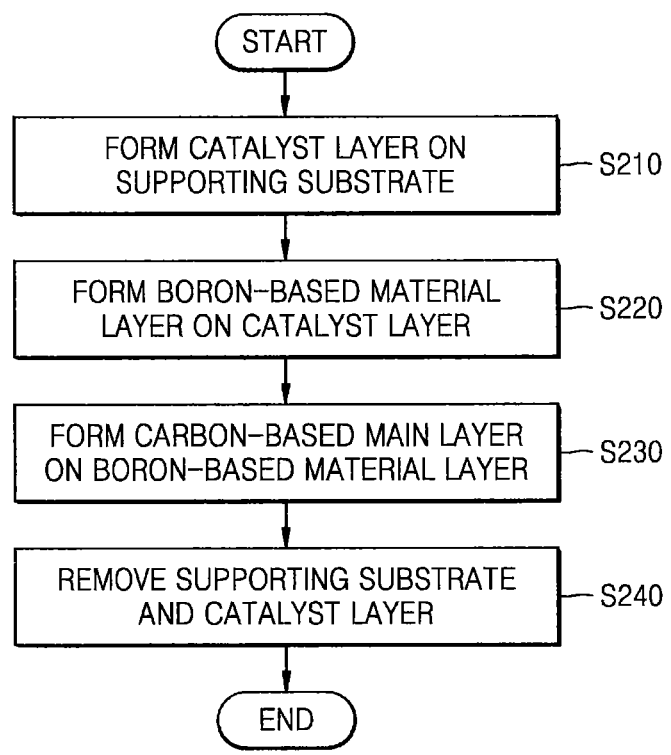
FIG. 8 is a flowchart illustrating a method of manufacturing a pellicle according to an example embodiment.

FIG. 8 is a flowchart illustrating a method of manufacturing the pellicle according to an example embodiment. FIGS. 9A to 9E are side views illustrating the method of manufacturing the pellicle according to the example embodiment of FIG. 8.

Figure 9A:
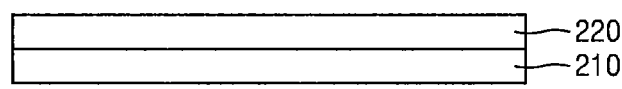
FIGS. 9A to 9E are side views illustrating a method of manufacturing a pellicle according to the example embodiment.

Referring to FIGS. 8 and 9A, a catalyst layer 220 is formed on a supporting substrate 210 (S210).

The supporting substrate 210 may be or may include any substrate that may support the catalyst 220, but example embodiments are not limited thereto. In some example embodiments, the supporting substrate 210 may be a silicon (Si) substrate or a glass substrate.

The catalyst layer 220 may be formed by chemical vapor deposition (CVD), physical vapor deposition (PVD), atomic layer deposition (ALD), or molecular layer deposition (MLD), but example embodiments are not limited thereto.

The catalyst layer 220 may include a metal or a metal compound. For example, the catalyst layer 220 may include at least one selected from chromium (Cr), nickel (Ni), copper (Cu), ruthenium (Ru), platinum (Pt), cobalt (Co), titanium (Ti), tantalum (Ta), aluminum (Al), or any other metals; alloys thereof; or metal compounds such as a titanium nitride (TiN) and a tantalum nitride (TaN).

Figure 9B:
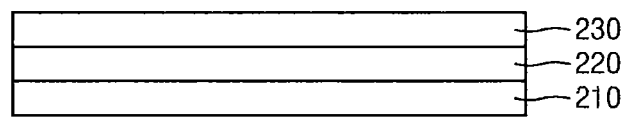

Referring to FIGS. 8 and 9B, a boron-based material layer 230 is formed on the catalyst layer 220 (S220). The boron-based material layer 230 may be elemental boron.

The boron-based material layer 230 may be formed by CVD, PVD, ALD, or MLD, but example embodiments are not limited thereto.

Boron precursors such as boranes, boron halogenides, borane halogenides, and composites thereof may be used to form the boron-based material layer 230.

Appropriate boranes may include compounds represented by Formula I or Formula II.

$$B_nH_{n+x} \quad \text{(Formula I)}$$

Here, n is an integer of 1 to 10, or, for example, an integer of 2 to 6, and x is an even number, or, for example, 4, 6, or 8.

$$B_nH_m \quad \text{(Formula II)}$$

Here, n is an integer of 1 to 10, or, for example, an integer of 2 to 6, and m is an integer of 1 to 10, or, for example, an integer of 2 to 6 but different from n.

Appropriate examples among the boranes represented by Formula I may include nido-boranes ($B_nH_{n+4}$), arachno-boranes ($B_nH_{n+6}$), and hypho-boranes ($B_nH_{n+8}$). Appropriate examples among the boranes represented by Formula II may include conjuncto-boranes ($B_nH_m$). Also, borane composites such as $(CH_3CH_2)_3N—BH_3$ may be used.

In some example embodiments, appropriate boron reactants may include a borane halogenide, particularly, a fluoride, a bromide, or a chloride. For example, an appropriate boron halogenide may have a ratio of boron to a halogen in a range of about 0.5 to about 1. An example of the appropriate compound is $B_2H_5Br$. Additional examples may include boron halogenides such as $B_2F_4$, $B_2Cl_4$, and $B_2Br_4$ that include a high ratio of boron/helogenide. Borane halogenide composites may also be used.

In some example embodiments, borane halogenides represented by Formula III may be appropriate boron reactants.

$$B_nX_n \quad \text{(Formula III)}$$

Here, X is Cl or Br. When X is Cl, n is an integer of 4 or 8 to 12. When X is Br, n is an integer of 7 to 10.

In some example embodiments, carboranes represented by Formula IV may be appropriate boron reactants.

$$C_2B_nH_{n+x} \quad \text{(Formula IV)}$$

Examples of the carboranes represented by Formula IV may include closo-carboranes ($C_2B_nH_{n+2}$), nido-carboranes ($C_2B_nH_{n+4}$), and arachno-carboranes ($C_2B_nH_{n+6}$).

In some example embodiments, amino-borane adducts represented by Formula V may be appropriate boron reactants.

$$R_3NBX_3 \quad \text{(Formula V)}$$

Here, R is each independently a linear or branched C1-C10, e.g., C1-C4, alkyl or H, and X is a linear or branched C1-C10, e.g., C1-C4, alkyl, H, or halogen.

In some example embodiments, amino boranes having an amino group as one or more substituents on B in Formula VI may be appropriate boron reactants.

$$R_2NBR_2 \quad \text{(Formula VI)}$$

Here, R is each independently a linear or branched C1-C10, e.g., C1-C4, alkyl or substituted or unsubstituted aryl group.

An example of an appropriate aminoborane is $(CH_3)_2NB(CH_3)_2$.

In some example embodiments, the appropriate boron reactant may include cyclic borazine ($B_3H_6N_3$) and/or volatile derivatives thereof.

In some example embodiments, alkyl borons or alkyl boranes may be appropriate boron reactants, and the alkyl may be generally a linear or branched C1-C10 alkyl, e.g., C2-C4 alkyl.

Deposition of the boron-based material layer 230 may be performed at a temperature, for example, in a range of about 200° C. to about 450° C. or about 250° C. to about 400° C.

When a boron oxide, instead of elemental boron, is used to form the boron-based material layer 230, $O_2$, $O_3$, plasma $O_2$, $H_2O$, $NO_2$, NO, $N_2O$ (a nitrous oxide), $CO_2$, $H_2O_2$, HCOOH, $CH_3COOH$, $(CH_3CO)_2O$, or a mixture thereof may be used as a reactant.

When a boron nitride, instead of elemental boron, is used to form the boron-based material layer 230, $NH_3$, mono-alkyl amine, di-alkylamine, tri-alkylamine, an organic amine compound, a hydrazine compound, or a mixture thereof may be used as a reactant.

Figure 9C:
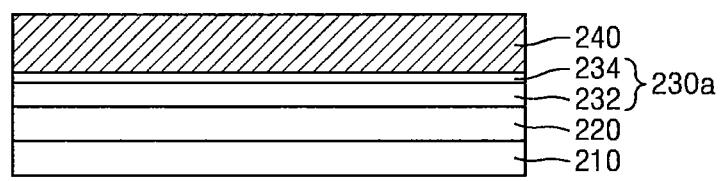

Then, referring to FIGS. 8 and 9C, a carbon-based main layer 240 may be formed on the boron-based material layer 230 (S230).

The carbon-based main layer 240 may be formed by CVD, PVD, ALD, or MLD, but example embodiments are not limited thereto.

A carbon compound for forming the carbon-based main layer 240 may use a carbon compound of a liquid phase or a gas phase and may be determined in consideration of molecular weight distribution, a concentration, a viscosity, a surface tension, and/or a dielectric constant. In some example embodiments, the carbon compound of a liquid phase or a gas phase may include at least one selected from the group including or consisting of methane, ethylene, acetylene, methylacetylene, vinylacetylene, ethanol, methanol, propanol, acetone, xylene, chloroform, ethylacetate, diethylether, polyethyleneglycol, ethylformate, mesitylene, tetrahydrofuran (THF), dimethylformamide (DMF), dichloromethane, hexane, benzene, carbon tetrachloride, and pentane.

In particular, the carbon compound in a liquid phase may include at least one selected from the group including or consisting of ethanol, methanol, propanol, acetone, xylene, chloroform, ethylacetate, diethylether, polyethyleneglycol, ethylformate, mesitylene, tetrahydrofuran (THF), dimethylformamide (DMF), dichloromethane, hexane, benzene, carbon tetrachloride, and pentane. For example, the carbon compound in a liquid phase may include at least one selected from the group including or consisting of ethanol ($C_2H_5OH$), xylene ($C_8H_{10}$), diethylether [$(C_2H_5)_2O$], polyethyleneglycol [$—(CH_2—CH_2—O)_9$], 1-propanol ($CH_3CH_2CH_2OH$), acetone ($CH_3OCH_3$), ethylformate ($CH_3CH_2COOH$), benzene ($C_6H_6$), hexane ($C_6H_{14}$), and mesitylene [$C_6H_3(CH_3)_3$].

The carbon compound in a gas phase may include at least one selected from the group including or consisting of methane, ethylene, acetylene, methylacetylene, and vinylacetylene.

A process of forming the carbon-based main layer 240 may include a process of annealing at a temperature, for example, in a range of about 560° C. to about 1100° C. or about 800° C. to about 1000° C. When the annealing temperature is low, e.g. too low, the effect produced by the annealing process may be insufficient, and a layer 234 of $B_4C$ may be insufficiently prepared. When the annealing temperature is high, e.g. too high, mechanical strength of the carbon-based main layer 240 may deteriorate.

As a result of the annealing process, $B_4C$ may be formed at an interface between elemental boron and the carbon-based main layer 240. For example, as shown in FIG. 9C, in the process of forming the carbon-based main layer 240 and performing annealing, the layer 234 of $B_4C$ may be formed between the carbon-based main layer 240 and a residual boron-based material layer 232. The layer 234 of $B_4C$ may be a layer that is formed when a part of the carbon-based main layer 240 and a part of the boron-based material layer 230 reacts during the annealing process. The layer 234 of $B_4C$ may form a new boron-based material layer 230a together with the residual boron-based material layer 232.

Figure 9D:
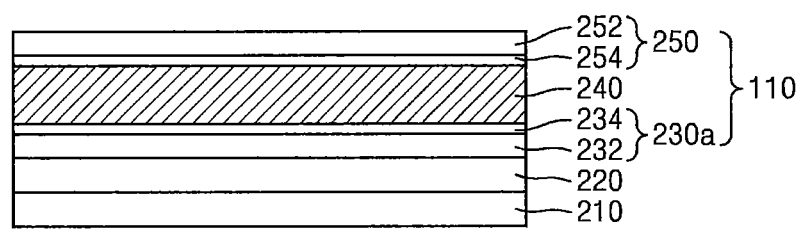

Further referring to FIG. 9D, a boron-based material layer 250 may be formed on the carbon-based main layer 240. The boron-based material layer 250 may be formed in the same manner as in the formation method of the boron-based material layer 230 described above with reference to FIG. 9B. However, when the boron-based material layer 230 in FIG. 9B is formed, the boron-based material layer 230, which is a layer of elemental boron, is formed since an adjacent carbon-based material does not exist, whereas when the boron-based material layer 250 in FIG. 9D is formed, a layer 254 of $B_4C$ and a layer 252 of elemental boron may be formed simultaneously since the layers are formed adjacent to the carbon-based main layer 240.

According to formation conditions of the boron-based material layer 250, each of thicknesses of the layers 252 and 254 that include the boron-based material 250 and each of thicknesses of the layers 232 and 234 that include the boron-based material layer 230a may be different from each other. For example, the thickness of layer 232 may be less than the thickness of layer 234. Alternatively, the thickness of layer 232 may be greater than the thickness of layer 234.

Figure 9E:
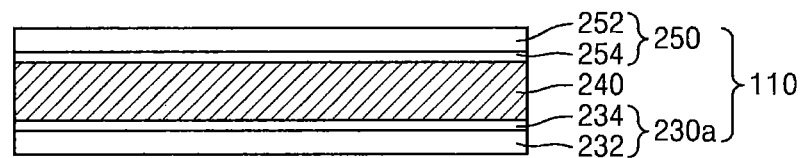

Referring to FIGS. 8 and 9E, the supporting substrate 210 and the catalyst layer 220 may be removed from a lower surface of the boron-based material layer 230a (S240). The supporting substrate 210 and the catalyst layer 220 may be removed from a lower surface of the boron-based material layer 230a by, for example, a wet process, e.g. a wet chemical process. In some example embodiments, the supporting substrate 210 and the catalyst layer 220 attached to the boron-based material layer 230a may be immersed into a solvent in a bath. The solvent may include a metal etching solution. For example, the solvent may be at least one selected from hydrogen peroxide, phosphoric acid, nitric acid, acetic acid, and a cyclic amine compound. The catalyst layer 220 may be etched by the solvent and thus removed.

A rinse process may be performed on the remaining structures 230a, 240, and 250 from which the supporting substrate 210 and the catalyst layer 220 are removed to remove the remaining solvent. A rising solution for the rinse process may be or may include deionized water (DIW) or a nitric acid and/or hydrochloric acid solution of a low concentration.

Although not shown in FIG. 9E, a process of attaching the frame 150 to the pellicle membrane 110 (see FIG. 1) may be followed. First, to attach the frame 150, the pellicle membrane 110 may be suspended on a liquid such as deionized water, and the frame 150 may be raised from inside of the deionized water to attach the pellicle membrane 110 on a top surface of the frame 150.

The liquid for floating the pellicle membrane 110 may be or may include an alcohol-based liquid such as methanol, ethanol, or isopropyl alcohol as well as deionized water. In this regard, surface characteristics of the pellicle membrane 110 may be considered. If a surface of the pellicle membrane 110 is hydrophobic, deionized water, e.g. deionized water having a surface tension at room temperature of 72.7 dyne/cm, and ethanol, e.g. ethanol having a surface tension at room temperature of 22.4 dyne/cm, may be mixed by controlling a ratio thereof so that the pellicle membrane 110 may be well flattened without wrinkles.

The frame 150 may be bonded to the pellicle membrane 110 by a van der Waals force directly contacting the frame 150 to the pellicle membrane 110 or by an adhesive 160 (see FIG. 1).

The pellicle according to an example embodiment may be used for an extended period of time even in an extreme ultraviolet light exposure environment.

<Comparative Example>

Figure 10A:
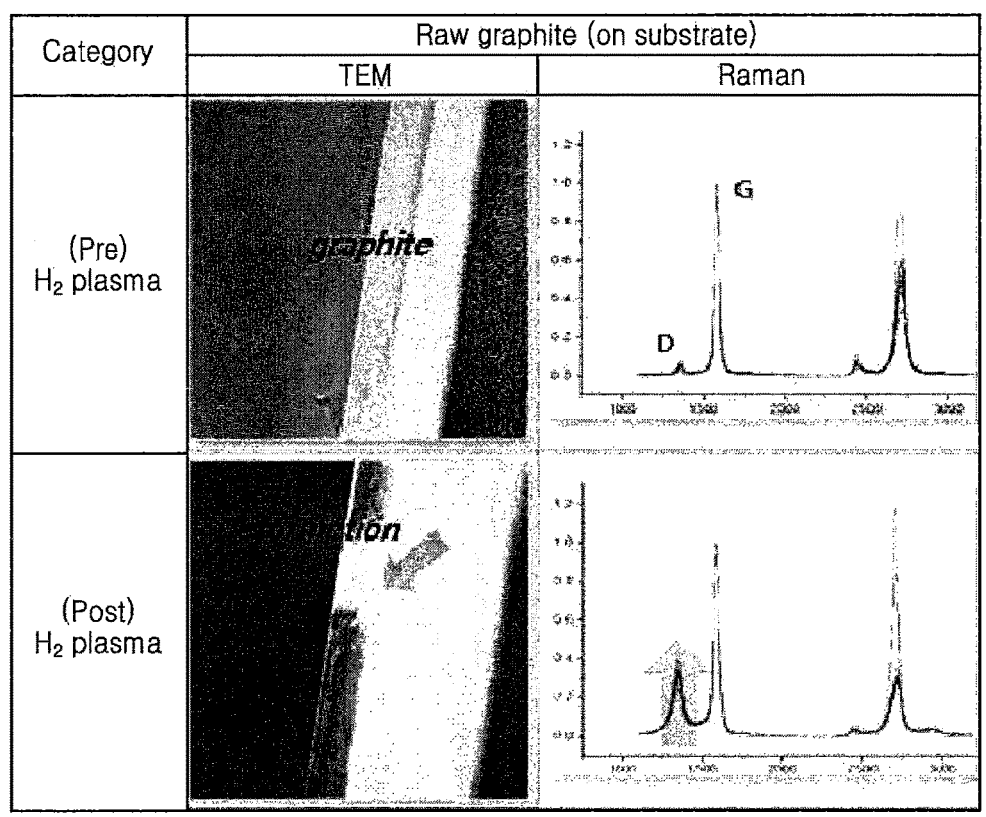
FIG. 10A includes transmission electron microscope (TEM) analysis and Raman spectrum analysis images, pre and post hydrogen plasma treatment, of a graphite layer formed on a substrate.

A graphite layer was formed on a substrate, and a transmission electron microscope (TEM) analysis and Raman spectrum analysis were performed on the graphite layer before and after performing a hydrogen plasma treatment, and the results are shown in FIG. 10A.

The hydrogen plasma treatment was performed by applying a power of 800 W in an ECR-CVD equipment and supplying a hydrogen gas at a flow rate of 50 sccm at a pressure of 10 mTorr.

As shown in the results of the Raman analysis in FIG. 10A, the intensity of a peak indicated by D significantly increased after the hydrogen plasma treatment compared to D before the hydrogen plasma treatment. This signified that and/or is consistent that the intensity of the peak increased due to damage arising from defects of the graphite and the hydrogen plasma treatment and due to vibration in atoms generated in these damaged areas of the graphite.

Also in the TEM image of FIG. 10A, a part of the graphite layer was damaged with a local defect after the hydrogen plasma treatment.

Figure 10B:
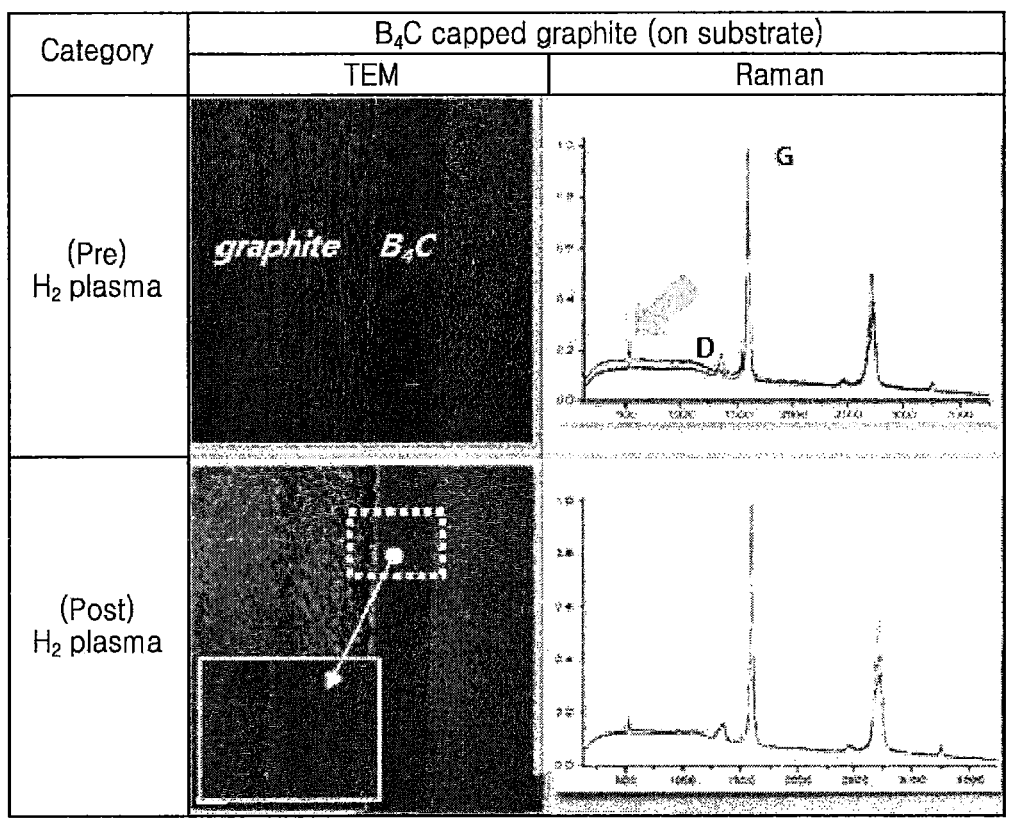
FIG. 10B includes transmission electron microscope (TEM) analysis and Raman spectrum analysis images, pre and post hydrogen plasma treatment, of a $B_4C$ layer formed on graphite.

A layer of $B_4C$ was formed on graphite, and a TEM analysis and a Raman spectrum analysis were performed on the layer before and after performing a hydrogen plasma treatment, and the results are shown in FIG. 10B.

As shown in the result of the Raman analysis in FIG. 10B, the intensity of a peak indicated by D almost did not change before and after the hydrogen plasma treatment. Thus, defects of the graphite were not further developed by the hydrogen plasma treatment. In other words, the layer of $B_4C$ was confirmed to protect the graphite, or reduce the likelihood of defects in the graphite.

A peak indicated by an arrow in FIG. 10B is estimated as it represents $B_4C$.

Also, as shown in the TEM image of FIG. 10B, the graphite and the layer of $B_4C$ were confirmed to be fully maintained even after the hydrogen plasma treatment.

Figure 11:
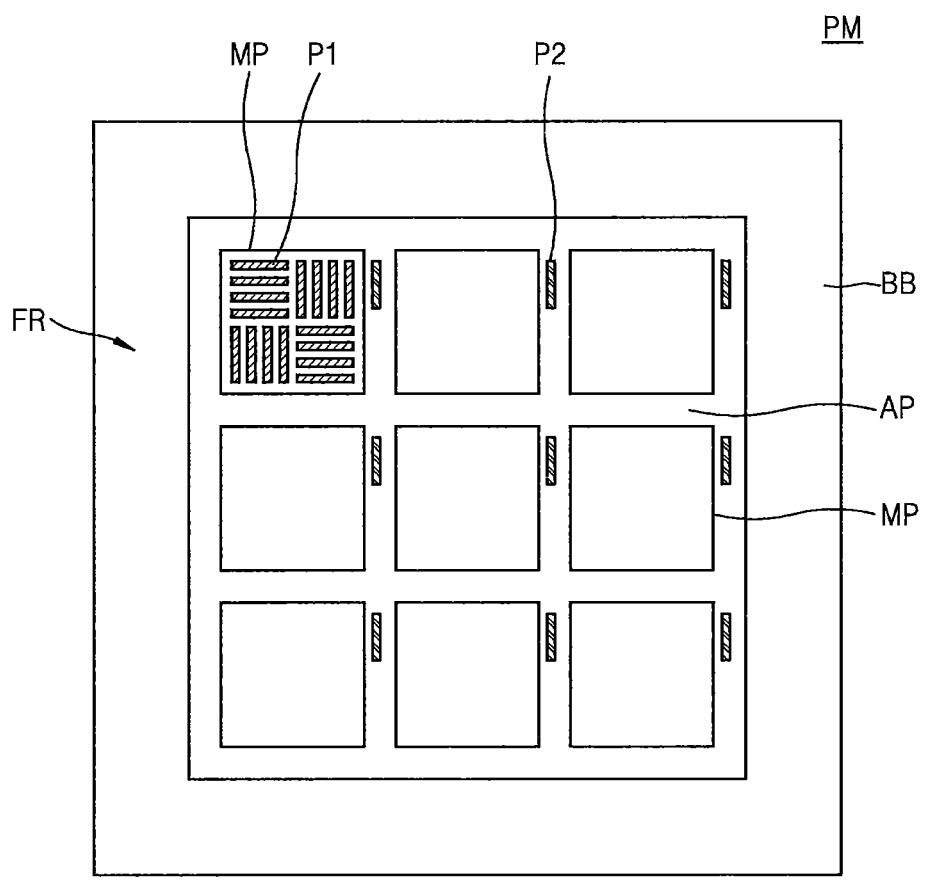
FIG. 11 is a plan view illustrating a schematic structure of an example photomask that is capable of binding with a pellicle according to an example embodiment.

FIG. 11 is a plan view illustrating a schematic structure of an example photomask PM that is capable of binding with the pellicle according to an example embodiment.

The photomask PM shown in FIG. 11 may be or may include a reflection-type photomask for manufacturing an integrated circuit such as a semiconductor device by transferring a pattern on a wafer (not shown) through light exposure. In some example embodiments, the photomask PM may be or may include a reflection-type photomask based on a multi-layer mirror structure that is used in a photolithography process using an EUV wavelength range, e.g., a light-exposure wavelength of about 13.5 nm.

A front side surface FR of the photomask PM may have a main pattern region MP for transferring a main pattern that is used to form unit devices that include an integrated circuit on a chip area on a wafer; an auxiliary pattern region AP for transferring an auxiliary pattern to a scribe lane region on the wafer; and a black border region BB that surrounds the main pattern region MP and the auxiliary pattern region AP.

Main pattern elementals P1 that include a main pattern for transferring a pattern used to form an integrated circuit on a chip area on a wafer may be formed on the main pattern region MP.

Auxiliary pattern elementals P2 for transferring an auxiliary pattern, for example, an align key pattern, to the scribe lane region on the wafer may be formed on the auxiliary pattern region (AP). The auxiliary pattern AP may be a pattern used during a manufacturing process of the integrated circuit but is not maintained in the final integrated circuit product. For example, the auxiliary pattern AP may be removed when the wafer is diced.

The black border region BB is a non-pattern region that does not include a pattern elemental for transferring a pattern on the wafer.

Figure 12:
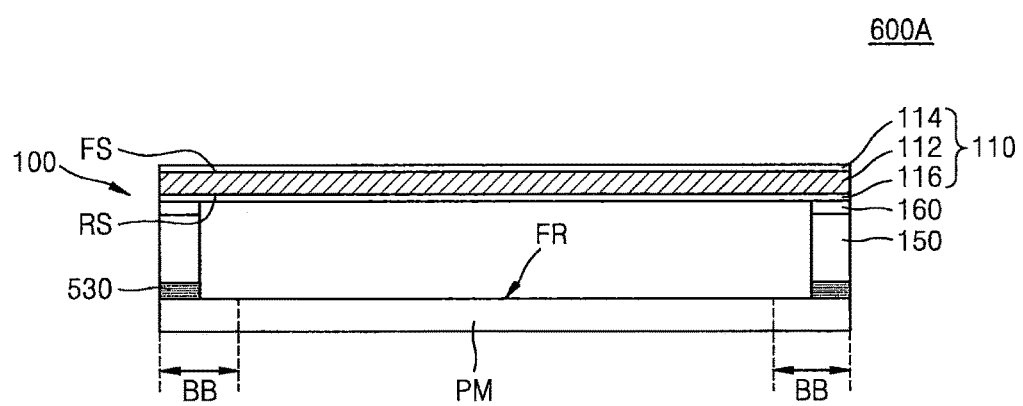
FIG. 12 is a cross-sectional view illustrating a photomask assembly according to an example embodiment.

FIG. 12 is a cross-sectional view illustrating a photomask assembly 600A according to an example embodiment.

Referring to FIG. 12, the photomask assembly 600A may include a photomask PM; and a pellicle 100 fixed on the black border region BB at the front side surface FR of the photomask PM.

An adhesion layer 530 may be between a surface of the frame 150 in the pellicle 100 opposite to a surface on which the pellicle membrane 110 is attached and the black border region BB of the photomask PM to fix the pellicle 100 on the black border region BB of the photomask PM.

The frame 150 has one end that is fixed to the pellicle membrane 110 through the adhesion layer 160 to support the pellicle membrane 110, and another end that is fixed to a surface of the photomask PM through the adhesion layer 530.

Detailed features of the pellicle 100 are the same as those described with reference to FIG. 1.

In some example embodiments, the adhesion layer 530 may be formed of a silicon resin, a fluorine resin, an acryl resin, or a poly(styrene-ethylene-butadiene-styrene) (SEBS)-based resin, but example embodiments are not limited thereto.

Figure 13:
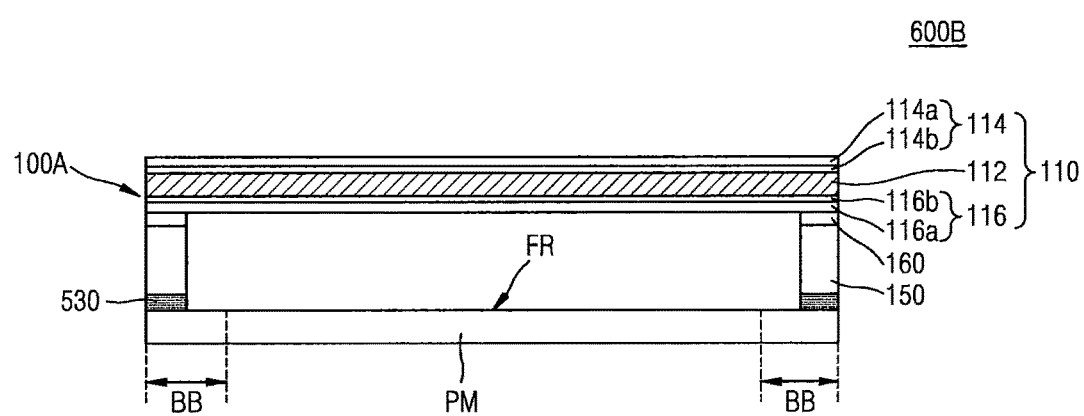
FIG. 13 is a cross-sectional view illustrating a photomask assembly according to another example embodiment.

FIG. 13 is a cross-sectional view illustrating a photomask assembly 600B according to another example embodiment.

Referring to FIG. 13, the photomask assembly 600B includes a photomask PM; and a pellicle 100A fixed on the black border region BB at the front side surface FR of the photomask PM. Detailed features of the pellicle 100A are the same as those described with reference to FIG. 3.

An adhesion layer 530 may be between a surface of the frame 150 opposite to a surface on which the pellicle membrane 110 is attached and the black border region BB of the photomask PM to fix the pellicle 100A on the black border region BB of the photomask PM.

Although the photomask assemblies 600A and 600B shown in FIGS. 12 and 13 are shown as including the reflection-type photomask PM to be used in a photolithography process using a light having a wavelength of about 13.5 nm as shown in FIG. 11, but example embodiments are not limited thereto. For example, a transmission-type photomask, for example, a photomask that is used in a light-exposure process using a KrF excimer laser (248 nm), an ArF excimer laser 193 nm, or a fluorine ($F_2$) excimer laser 157 nm may be used instead of the reflection type photomask PM.

Figure 14:
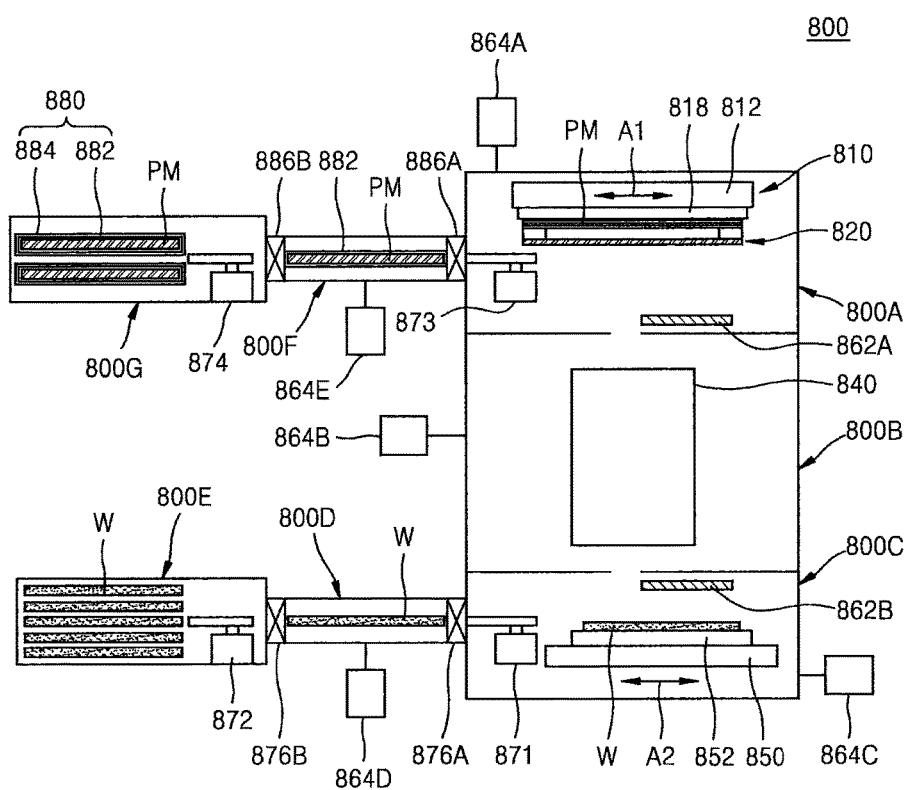
FIG. 14 is a cross-sectional view illustrating schematic features of an integrated circuit device manufacturing apparatus according to example embodiment.

FIG. 14 is a cross-sectional view illustrating a schematic feature of an integrated circuit device manufacturing apparatus 800 according to example embodiments. FIG. 14 shows the integrated circuit device manufacturing apparatus 800 that includes a light-exposure device that miniaturize-transfers a pattern image shown on a photomask or, also referred to as "reticle" by using EUV light to a wafer in vacuum in a projection optical system as an example.

Referring to FIG. 14, the integrated circuit device manufacturing apparatus 800 may include a mask stage region 800A, a projection optical system region 800B, and a wafer stage region 800C.

A mask stage 810 located in the mask stage region 800A may include a mask stage support 812, and a mask holder system 818 fixed to the mask stage support 812. The mask holder system 818 may fix the photomask PM. In some example embodiments, the mask holder system 818 may include an electrostatic chuck, and the mask holder system 818 may adsorb and maintain the photomask PM by an electrostatic force.

A pellicle 820 may be fixed to the photomask PM. The pellicle 820 maybe formed of a pellicle having a modified and changed structure from the pellicles 100, 100A, 100B, 100C, and 100D described with reference to FIGS. 1, 3, 5, 7A, and 7B, within the scope of inventive concepts.

The mask stage 810 may move the photomask PM that is supported by and fixed onto the mask stage support 812 in a scanning direction shown by an arrow A1.

A projection optical system 840 for transferring a pattern formed on the photomask PM to a wafer W in the wafer stage region 800C may be located in the projection optical system region 800B. The wafer W may be fixed and maintained on a wafer chuck 852 on a wafer stage 850. The wafer chuck 852 may move the wafer W in scanning directions shown by an arrow A2.

The mask stage region 800A including the mask stage 810, the projection optical system region 800B having the projection optical system 840 thereon, and the wafer stage region 800C including the wafer stage 850 may be each separated by gate valves 862A and 862B. Vacuum exhausting devices 864A, 864B, and 864C are connected to the mask stage region 800A, the projection optical system region 800B, and the wafer stage region 800C, each respectively, and thus a pressure may be independently controlled.

A return hand 871 for carrying-in or carrying-out the wafer W may be equipped between the wafer stage region 800C and a loadlock chamber 800D. A vacuum exhausting device 864D is connected to the loadlock chamber 800D. The wafer W may be temporarily stored in a wafer load port 800E under the atmospheric pressure. A return hand 872 for carrying-in or carrying-out the wafer W may be equipped between the loadlock chamber 800D and the wafer load port 800E. A gate valve 876A is between the wafer stage region 800C and the loadlock chamber 800D. A gate valve 876B is between the loadlock chamber 800D and the wafer load port 800E.

A return hand 873 for carrying-in or carrying-out the photomask PM may be equipped between the mask stage 810 of the mask stage region 800A and a mask loadlock chamber 800F. A vacuum exhausting device 864E is connected to the mask loadlock chamber 800F. The photomask PM may be temporarily stored in a mask load port 800G under the atmospheric pressure. A return hand 874 for carrying-in or carrying-out the photomask PM is equipped between the mask loadlock chamber 800F and the mask load port 800G. A gate valve 886A may be inserted between the mask stage region 800A and the mask loadlock chamber 800F. A gate valve 886B may be inserted between the mask loadlock chamber 800F and the mask load port 800G.

The photomask PM is stored and transported by being carried in a photomask carrier 880 until transported to the integrated circuit device manufacturing apparatus 800 from the outside and may be transported to the mask load port 800G in the state of being contained in the photomask carrier 880. In this regard, the photomask PM may be effectively protected from unnecessary contact with the external environment and particle contamination of the outside.

The photomask carrier 880 may include an inner pod 882; and an outer pod 884 that provides a space for accommodating the inner pod 882. The inner pod 882 and the outer pod 884 may be each formed of a standard mechanical interface (SMIF) pod that follows the SEMI standard E152-0709. The outer pod 884 may be also referred to as "a reticle SMIF pod" and may protect the photomask PM when the photomask PM is transferred between two different manufacture stations or between two different locations. The inner pod 882 may protect the photomask PM while the photomask PM is transferred in a vacuum atmosphere or to the mask stage 810 and near the mask stage 810. When the surrounding environment is pressure-reduced from an atmospheric state to a vacuum state or changes from a vacuum state to an atmospheric state, swirl of contamination particles may be caused, and thus, as a result, contamination particles floating around the photomask PM may contaminate the photomask PM. The inner pod 882 may help to protect the photomask PM from this environment and thus may protect the photomask PM until the photomask PM is transferred in a vacuum atmosphere or to the mask stage 810 and near the mask stage 810.

In a light-exposure process among the manufacture process of a semiconductor device, a pattern formed on a photomask (reticle) on a wafer having a resist layer is projection light-exposed to form a latent pattern on the resist layer, and thus a resist pattern is formed on the wafer through a development process. However, when impurities, e.g., particles, exist on the photomask, the impurities may also be transferred on the wafer along with the pattern and thus may cause pattern defect, for example a repeating defect.

In the manufacture process of a semiconductor device on which an ultrafine pattern, such as LSI or VLSI, is formed, a pattern formed on the photomask may be downsize-projected on a resist layer formed on a wafer, and thus a downsize projection light-exposure device forming a latent pattern on the resist layer may be used. As a mounting density of the semiconductor device increases, miniaturization of a circuit pattern is required, and a demand for miniaturizing a light-exposure line width in the light-exposure device has increased. Accordingly, a method of making the light-exposure wavelength as a shorter wavelength has been developed to improve a resolving power performance of the light-exposure device. Thus far, light-exposure techniques using an i-line (365 nm), a KrF excimer laser (248 nm), an ArF excimer laser (193 nm), and a fluorine ($F_2$) excimer laser (157 nm) have been developed, and, in recent years, a light-exposure device using EUV light or an electronic ray having a wavelength of a soft X-ray band near 6.75 nm to 13.5 nm has been developed. When the wavelength of the light-exposure light is shortened to the EUV light or electronic ray level, a light pathway of the light-exposure light is desired to be in a high-vacuum environment since air does not transmit light under the atmospheric pressure. Therefore, a wafer or a photomask is desired to be carried-in and carried-out in a state of maintaining a vacuum degree by locating an optical system, a mask stage, and a wafer stage in a vacuum chamber having an air-tightness that is greater than that of a $F_2$ light-exposure device and equipping a loadlock chamber at a carry-in/carry-out port of each of the wafer and the photomask.

In the EUV light-exposure, a reflection-type photomask may be used, wherein the photomask includes a multi-reflection layer on a front side surface on which a pattern region is formed as a photomask.

When the wavelength of the light-exposure light is shortened up to the EUV band, light exposure has been performed without using a pellicle or a pellicle including a pellicle membrane of a thin-film type having relatively severe deterioration caused by heat during light-exposure and a weak tensile strength since selection of materials transparent in EUV is limited A pellicle membrane in a very thin thickness of several tens of nm level to a thickness desired, or a maximum thickness needed to be used as the pellicle membrane to satisfy a transparency with respect to EUV. However, a carbon-based material having a relatively high emissivity may be used as a pellicle membrane to reduce deterioration caused by heat during the light-exposure. However, the carbon-based material may be easily damaged by hydrogen plasma that occurs in an environment exposed to extreme ultraviolet light.

The integrated circuit device manufacturing apparatus according to an example embodiment of inventive concepts protect a photomask PM by using the pellicle 820 according to an example embodiment in light exposure using an EUV light source. The pellicle 820 according to an example embodiment has a carbon-based material as a main layer and a chemical enhancement layer added thereon to protect the carbon-based main layer. Thus a lifespan of the pellicle membrane may be increased, e.g. the lifespan may be sufficiently secured despite hydrogen plasma occurring in the environment exposed to EUV light. In particular, since an intermixing layer exists between the carbon-based main layer and the chemical enhancement layer, and thus an adhesive strength between the carbon-based main layer and the chemical enhancement layer may significantly improve. In this regard, errors caused by deterioration of the pellicle layer during light exposure may be effectively prevented or reduced in likelihood of occurrence, and a pattern of a desired shape may be effectively transferred to an exact location on the wafer W, which is the subject of the light-exposure, as well as a lifespan of the pellicle may increase.

Figure 15:
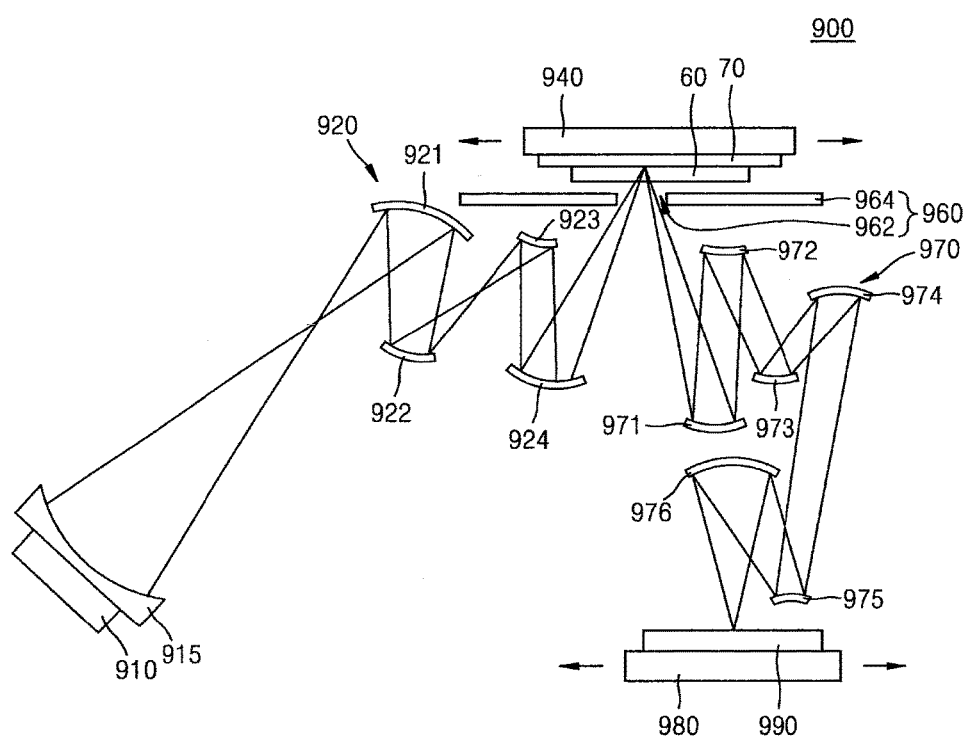
FIG. 15 is a conceptual view illustrating a reflection-type photolithography process performed by using a reticle to which a pellicle according to an example embodiment is attached.

FIG. 15 is a conceptual view illustrating performing a reflection-type photolithography process by using a reticle 70 that has a pellicle 60 attached thereon.

Referring to FIG. 15, the method of performing a reflection-type photolithography process by using the reticle 70 that has the pellicle 60 attached thereon may include mounting the reticle 70 that has the pellicle 60 attached thereon on a reticle stage 940 of a reflection-type photolithography system 900 such that the reticle 70 faces down from the reticle stage 940, wherein the reflection-type photolithography system 900 includes a light source 910, an illumination mirror system 920, the reticle stage 940, a blinder 960, a projection mirror system 970, and a wafer stage 980.

The light source 910 may generate extreme ultraviolet light (EUVL). For example, the light source 910 may generate light having a wavelength of extreme ultraviolet light, for example, about 13.5 nm by using carbon plasma. The light source 910 may include a light collector 915. The light collector 915 may collect the EUVL generated from the light source 910 and control the EUVL to be forwarded straight in one direction. For example, the EUVL generated from the light source 910 may pass the light collector 915 and then irradiated to the illumination mirror system 920.

The illumination mirror system 920 may include a plurality of illumination mirrors 921 to 924. For example, the illumination mirrors 921 to 924 may condense the EUVL to reduce losing the light off a mirrored irradiation pathway. Also, the illumination mirrors 921 to 924 may, for example, control the overall intensity distribution to be even. Thus, the plurality of illumination mirrors 921 to 924 may each include a concave mirror and/or a convex mirror to vary pathways of the EUVL. Also, the illumination mirror system 920 may mold the EUVL into a square shape, a circular shape, or a bar shape and transmit the EUVL to the reticle stage 940.

The reticle stage 940 may equip the reticle 70 on a lower surface and move in a horizontal direction. For example, the reticle stage 940 may move in directions indicated by arrows. The reticle stage 940 may include an electrostatic chuck (ESC). The reticle 70 may include optical patterns in one surface thereof. The reticle 70 may be equipped on the lower surface of the reticle stage 940 such that the surface having the optical patterns faces down in the drawing.

The blinder 960 may be under the reticle stage 940. The blinder 960 may include a slit 962 and a plate 964. The slit 962 may have an aperture shape. The slit 962 may mold a shape of the EUVL that is transmitted from the illumination mirror system 920 to the reticle 70 on the reticle stage 940. The EUVL transmitted from the illumination mirror system 920 passes through the slit 962 and may be irradiated to the reticle on the reticle stage 940. The EUVL reflected from the reticle 70 on the reticle stage 940 may pass through the slit 962 and transmitted to the projection mirror system 970. The plate 964 may block the EUVL irradiated on a region other than the slit 962. Thus, the blinder 960 may allow a part of the EUVL to pass through the slit 962 and may use the plate 964 to block a part of the EUVL. Also, the EUVL reflected from the reticle 70 equipped on the lower surface of the reticle stage 940 may pass through the slit 962.

The projection mirror system 970 may be receive the EUVL that is reflected from the reticle 70 and passed through the slit 962 and transmit the EUVL to a wafer 990. The projection mirror system 970 may also include a plurality of projection mirrors 971 to 976. The EUVL irradiated on the wafer 990 by the projection mirrors 971 to 976 may include virtual aerial image information of the optical patterns of the reticle 70. A shape of the EUVL irradiated on the wafer 990 may be the same as the shape molded by the slit 962. The plurality of projection mirrors 971 to 976 may correct various aberrations.

The wafer stage 980 may settle the wafer 990 and move the wafer 990 in horizontal directions. For example, the wafer 990 may move in directions indicated by arrows. The wafer stage 980 may simultaneously move in the same direction with a direction the reticle stage 940 moves at a constant ratio. For example, when a moving ratio is 10:1 (10%), in the case of the reticle stage 940 moving 10 μm to the left or to the right, the wafer stage 980 may move 1 μm in the same direction. Also, when a moving ratio is 5:1 (20%), in the case the reticle stage 940 moving 10 μm to the left or to the right, and the wafer stage 980 may move 2 μm in the same direction. The moving ratio may be set variously. For example, the wafer stage 980 may move in a step-and-scan manner. A focus of the EUVL irradiated from the projection mirror system 970 may be on a surface of the wafer 990. For example, a photoresist layer having a constant thickness is formed on the wafer 990, and the focus of the EUVL may be in the photoresist layer.

In the drawing, pathways through which the EUVL propagates are conceptually illustrated to help understanding of the technical concept.

Figure 16:
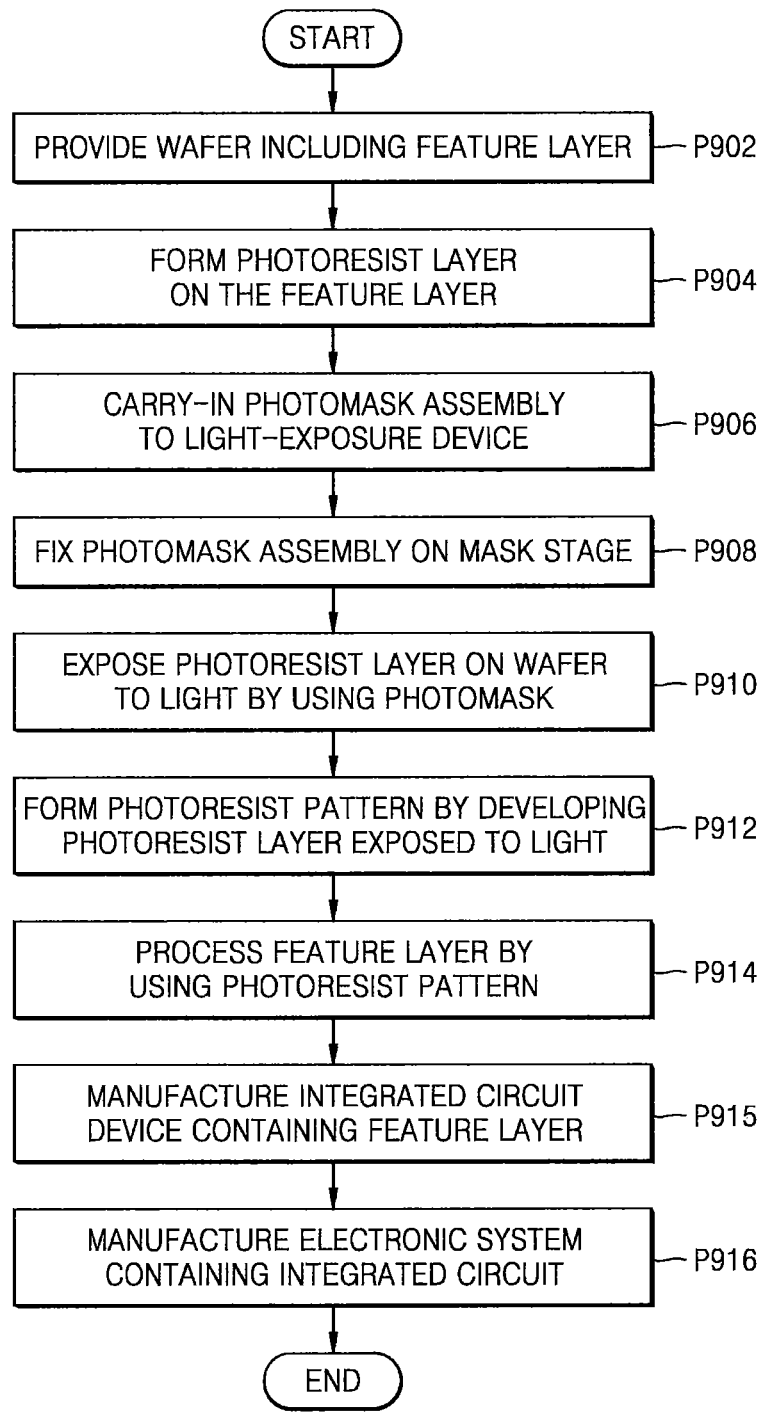
FIG. 16 is a flowchart illustrating a method of manufacturing an electronic system according to example embodiments.

FIG. 16 is a flowchart illustrating a method of manufacturing an electronic system according to example embodiments.

Referring to FIG. 16, in process P902, a wafer including a feature layer is provided.

In some example embodiments, the feature layer may be or may include a conducting layer or an insulating layer formed on the wafer. For example, the feature layer may be formed of a metal, a semiconductor, or an insulating material. In other example embodiments, the feature layer may be a part of the wafer.

In process P904, a photoresist layer is formed on the feature layer. In some example embodiments, the photoresist layer may be formed of a resist material for EUV (6.75 nm or 13.5 nm). In other example embodiments, the photoresist layer may be formed of a resist for a F2 excimer laser (157 nm), a resist for an ArF excimer laser (193 nm), or a resist for a KrF excimer laser (248 nm). The photoresist layer may be formed of a positive-type photoresist or a negative-type photoresist.

In some example embodiments, a photoresist composition including a photosensitive polymer having an acid-labile group, a potential acid, and/or a solvent may be spin-coated on the feature layer to form a photoresist layer formed of the positive-type photoresist.

In some example embodiments, the photosensitive polymer may include a (meth)acrylate-based polymer. The (meth)acrylate-based polymer may be an aliphatic (meth) acrylate-based polymer. For example, the photosensitive polymer may be polymethylmethacrylate (PMMA), poly (t-butylmethacrylate), poly(methacrylic acid), poly(norbornylmethacrylate)), a binary or ternary copolymer of repeating units of the (meth)acrylate-based polymers, or a mixture thereof. Also, these photosensitive polymers may have been substituted with various acid-labile protecting groups. The protecting groups may include a tertbutoxycarbonyl (t-BOC) group, a tetrahydropyranyl group, a trimethylsilyl group, a phenoxyethyl group, a cyclohexenyl group, a tert-butoxycarbonylmethyl group, a tert-butyl group, an adamantly group, or a norbornyl group. However, example embodiments are not limited thereto.

In some example embodiments, the potential acid may be formed of a photoacid generator (PAG), a thermoacid generator (TAG), or a combination thereof. In some example embodiments, the PAG may be formed of a material that produces an acid when exposed to light which is one selected from EUV light (13.5 nm), a F2 excimer laser (157 nm), an ArF excimer laser (193 nm), and a KrF excimer laser (248 nm). The PAG may be formed of an onium salt, a halogen compound, a nitrobenzyl ester, an alkylsulfonate, a diazonaphthoquinone, an iminosulfonate, a disulfine, a diazomethane, or a sulfonyloxyketone.

In process P906 of FIG. 16, a photomask assembly according to an example embodiment may be carried-in to a light-exposure device.

In some example embodiments, the photomask assembly may be one selected from the photomask assemblies 600A and 600B described with reference to FIGS. 12 and 13 and photomask assemblies modified and changed therefrom.

In some example embodiments, the photomask assembly may be carried-in up to the mask load port 800G of the integrated circuit device manufacturing apparatus 800 shown in FIG. 14.

In process P908 of FIG. 16, the photomask assembly may be fixed on a mask stage.

In some example embodiments, the mask stage may be the mask stage 810 of the integrated circuit device manufacturing apparatus 800 shown in FIG. 14.

In process P910, a photoresist layer on a wafer is exposed to light by using the photomask.

In some example embodiments, light exposure may be performed by using a reflection-type light-exposure meter, but example embodiments are not limited thereto. For example, a transmission-type light-exposure meter may be used in light exposure.

In process P912, the light-exposed photoresist layer is developed to form a photoresist pattern.

In process P914, the feature layer is processed by using the photoresist pattern.

In some example embodiments, the feature layer may be etched by using the photoresist pattern as an etching mask, and thus a fine feature pattern may be formed to process the feature layer according to process P914.

In other example embodiments, impurity ions may be injected to the feature layer by using the photoresist pattern as an ion injection mask to process the feature layer according to process P914. In other example embodiments, a separate process film may be formed on the feature layer which is being exposed through the photoresist pattern formed in process P912 to process the feature layer according to process P914. The process film may be formed of a conducting layer, an insulating layer, a semiconductor layer, or a combination thereof.

In process P915, an integrated circuit device containing the feature layer is manufactured.

In process P916, an electronic device containing the integrated circuit is manufactured.

Figure 17:
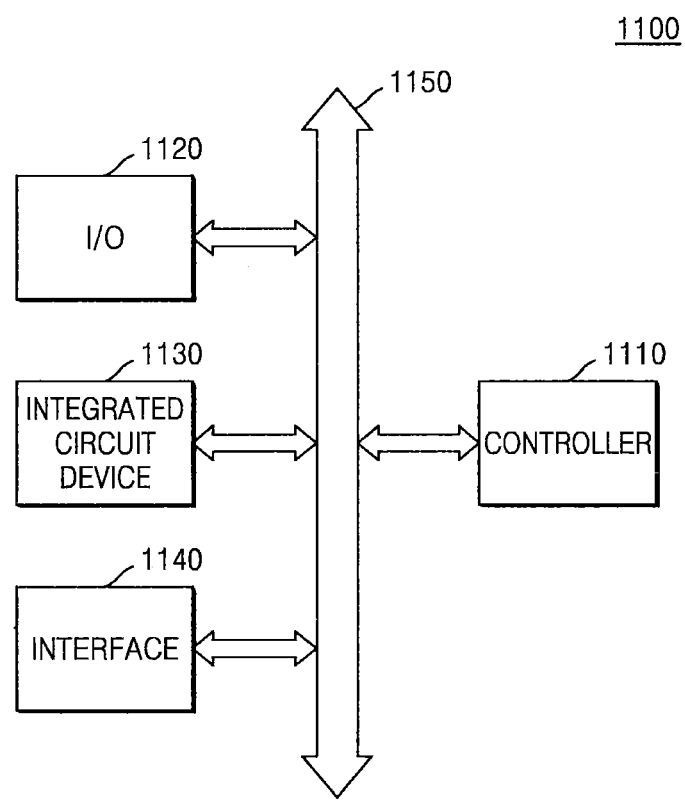
FIG. 17 is a block diagram illustrating an example of an electronic system including the integrated circuit device according to example embodiments of inventive concepts.

FIG. 17 is a block diagram illustrating an example of an electronic system including an integrated circuit device manufactured according to embodiments of the inventive concepts.

Referring to FIG. 17, an electronic system 1100 manufactured according to an embodiment of inventive concepts may include an integrated circuit device 1130, a controller 1110, an input/output (I/O) device 1120, an interface 1140, and a bus 1150.

The integrated circuit device 1130 may be an integrated circuit device manufacturing according to the process in FIG. 16.

The controller 1100, the I/O device 1120, the integrated circuit device 1130, and/or the interface 1140 may be connected to each other via the bus 1150. The bus 1150 corresponds to a path along which data are transmitted.

The controller 1110 may include at least one of a microprocessor, a digital signal processor, a microcontroller, and logic elements capable of performing similar functions to those of a microprocessor, a digital signal processor and a microcontroller. The I/O device 1120 may include a keypad, a keyboard, and a display device. The memory device 1130 may store data and/or commands. The interface 1140 may be used to transmit/receive data to/from a communication network. The interface 1140 may be a wired or wireless interface. In an example embodiment, the interface 1140 may include an antenna or a wired/wireless transceiver. Although not shown, the electronic system 1100 may include an operating memory for improving the operation of the controller 1110 and may further include a high-speed dynamic random access memory (DRAM) and/or SRAM.

The electronic system 1100 may be applied to all types of electronic products capable of transmitting and/or receiving information in a wireless environment, such as a personal digital assistant (PDA), a portable computer, a web tablet, a wireless phone, a mobile phone, a digital music player, and a memory card.

While inventive concepts has been particularly shown and described with reference to example embodiments thereof, it will be understood that various changes in form and details may be made therein without departing from the spirit and scope of the following claims.

What is claimed is:

1. A pellicle for extreme ultraviolet light (EUVL) exposure, the pellicle comprising:
   a pellicle membrane including a carbon-based main layer having a first surface and a second surface opposite to the first surface, a boron-based enhancement layer covering at least one of the first surface and the second surface, and an interface between the carbon-based main layer and the boron-based enhancement layer; and
   a frame attached to the pellicle membrane,
   wherein the interface between the carbon-based main layer and the boron-based enhancement layer includes a continuous gradient of carbon.

2. The pellicle of claim 1, wherein the boron-based enhancement layer comprises at least one selected from elemental boron, $B_4C$, a boron oxide, and a boron nitride.

3. The pellicle of claim 2, wherein the boron-based enhancement layer includes a structure in which a layer of elemental boron and a layer of $B_4C$ are stacked.

4. The pellicle of claim 3, wherein the layer of $B_4C$ and the layer of elemental boron are sequentially stacked on the carbon-based main layer in an order of the layer of $B_4C$ to the layer of elemental boron.

5. The pellicle of claim 3, wherein a change in concentration of boron exists across the interface between the layer of $B_4C$ and the layer of elemental boron, and the concentration of boron increases in a direction further from a center of the carbon-based main layer.

6. The pellicle of claim 1, wherein the concentration of carbon increases in a direction toward the carbon-based main layer.

7. The pellicle of claim 2, wherein the boron-based enhancement layer is substantially a layer of 134C.

8. The pellicle of claim 1, wherein the carbon-based main layer includes sp2 bonds and sp3 bonds, wherein an amount of the sp3 bonds is at least 10 times greater than that of the sp2 bonds, or the carbon-based layer includes only sp2 bonds.

9. The pellicle of claim 1, wherein the boron-based enhancement layer covers the first surface and the second surface of the pellicle membrane.

10. A pellicle for EUVL, the pellicle comprising:
    a pellicle membrane including a carbon-based main layer having a first surface and a second surface opposite to the first surface, a hydrogen plasma resistant chemical enhancement layer covering at least one of the first surface and the second surface, an intermixing layer exists across an interface between the carbon-based main layer and the chemical enhancement layer includes a component derived from the carbon-based main layer and a component derived from the chemical enhancement layer; and a frame attached to the pellicle membrane.

11. The pellicle of claim 10, wherein the chemical enhancement layer includes a chemical enhancement layer of a boron-based material, and the chemical enhancement layer of the boron-based material comprises at least one selected from elemental boron, $B_4C$, a boron oxide, and a boron nitride.

12. The pellicle of claim 10, wherein the chemical enhancement layer includes a chemical enhancement layer of a silicon-based material, and the chemical enhancement layer of the silicon-based material comprises at least one selected from a silicon oxide, a silicon nitride, and a silicon oxynitride.

13. The pellicle of claim 10, wherein the chemical enhancement layer includes a chemical enhancement layer of a 5th period transition metal, and the chemical enhancement layer of the 5th period transition metal comprises at least one selected from ruthenium (Ru), zirconium (Zr), and molybdenum (Mo).

14. The pellicle of claim 10, wherein a first chemical enhancement layer and a second chemical enhancement layer are respectively provided on the first surface and the second surface, and the first chemical enhancement layer and the second chemical enhancement layer are different from each other.

* * * * *